United States Patent [19]
Gresko

[11] Patent Number: 5,959,507
[45] Date of Patent: Sep. 28, 1999

[54] CATV PASSIVE COMPONENT WITH RF SPLITTER AND POWER ADDING/REMOVAL PORT

[75] Inventor: Richard Gresko, Huntingdon Valley, Pa.

[73] Assignee: General Instrument Corporation, Horsham, Pa.

[21] Appl. No.: 09/005,649

[22] Filed: Jan. 12, 1998

[51] Int. Cl.[6] .................................................. H03H 7/46
[52] U.S. Cl. .......................................... 333/100; 333/132
[58] Field of Search ..................................... 333/100, 112, 333/119, 129, 131, 132

[56] References Cited

U.S. PATENT DOCUMENTS

| | | | |
|---|---|---|---|
| 4,755,776 | 7/1988 | Preschutti | 333/100 |
| 5,805,042 | 9/1998 | Chastain et al. | 333/131 X |

*Primary Examiner*—Paul Gensler
*Attorney, Agent, or Firm*—Volpe and Koenig, P.C.

[57] ABSTRACT

A CATV passive signal component is disclosed performing bidirectional power insertion or extraction while providing directional RF signal splitting. The signal splitter presents a low burden to the distribution system and can bidirectionally pass alternating or direct current already impressed on the RF signal, or, provide an insertion or extraction function.

18 Claims, 3 Drawing Sheets

CATV PASSIVE COMPONENT WITH RF SPLITTER AND POWER ADDING/REMOVAL PORT

BACKGROUND OF THE INVENTION

1. Field of the Invention

This invention relates generally to cable television communication system distribution components. More particularly, the invention relates to a passive signal component that obviates standard CATV power inserters by permitting power insertion or extraction in either direction of a bidirectional cable television communication system.

2. Description of the Prior Art

Many different types of cable television (CATV) communication systems exist providing a large diversity of services. Conventional one-way CATV systems primarily provide broadcast video services, which are sent over a CATV transmission network in a downstream direction, from a headend of a CATV network to a plurality of subscriber terminals. Bidirectional CATV systems allow subscribers to interact with their programming providers which have become commonplace in the industry as the diversity of services has grown. New services that are under development will rely on the full use and deployment of the return path communication.

The CATV transmission network usually comprises a trunk system designed for the bulk transport of the plurality of CATV services. Bridging amplifiers are used to feed signals from the trunk system to a distribution system, then onto individual subscriber drops.

A CATV transmission distribution plant includes coaxial cables, signal couplers/splitters, amplifiers, and subscriber taps. When placed in the signal path, passive transmission devices attenuate the signal. Normally, the system is designed with unity gain from the headend to each subscriber terminal, taking into account the signal losses throughout the trunk, branch lines and subscriber drops. As the signal proceeds along the distribution system, the attenuation of the coaxial cable and the burden of passive devices reduces the signal to a level such that amplification may be required. Line extender amplifiers, which provide the amplification, require a source of power.

The line amplifiers are usually suspended by the signal carrying coaxial cable support strand between telephone poles and are powered from the signal coaxial cable. Rather than distributing the power with separate power cables, alternating current is periodically inserted into the signal carrying coaxial cable via CATV power inserters.

A power inserter impresses the alternating current source on the coaxial cable without interfering with the RF signal. The power inserter houses a low pass filter for 60 cycle, 60 Vac and a band rejection filter for the RF signal present on the coaxial cable. The power inserter, namely the filter network, is located in a weather and RFI proof housing and is also suspended on the cable strand. Pole mounted ferroresonant transformers provide the reduction and isolation of the local utility power supply to the power inserter. The line amplifier separates the RF signal from the impressed 60 Vac with a low pass filter to rectify the current for use in powering the amplifier. A high pass filter passes the RF signal to the amplifier gain stages.

Rather than using a separate device for power insertion, it is desirable to include power insertion or extraction at the signal splitters.

To reduce the complexity of CATV distribution systems and further increase installation flexibility and overall performance, it is desirable to include more power insertion options in standard CATV signal splitters.

SUMMARY OF THE INVENTION

A CATV signal component is presented that allows direct, bidirectional power insertion or extraction while providing RF signal splitting. The signal splitter has a low burden on the distribution system and can bidirectionally pass alternating or direct current already impressed on the RF signal or provide an insertion or extraction function.

Accordingly, it is an object of the present invention to provide a CATV signal splitter with a power port.

It is a further object of the invention to provide a signal splitter while allowing either power insertion or extraction with a minimal system burden.

Other objects and advantages of the signal component will become apparent to those skilled in the art after reading the detailed description of the preferred embodiment.

DESCRIPTION OF THE PREFERRED EMBODIMENTS

Figure 1:
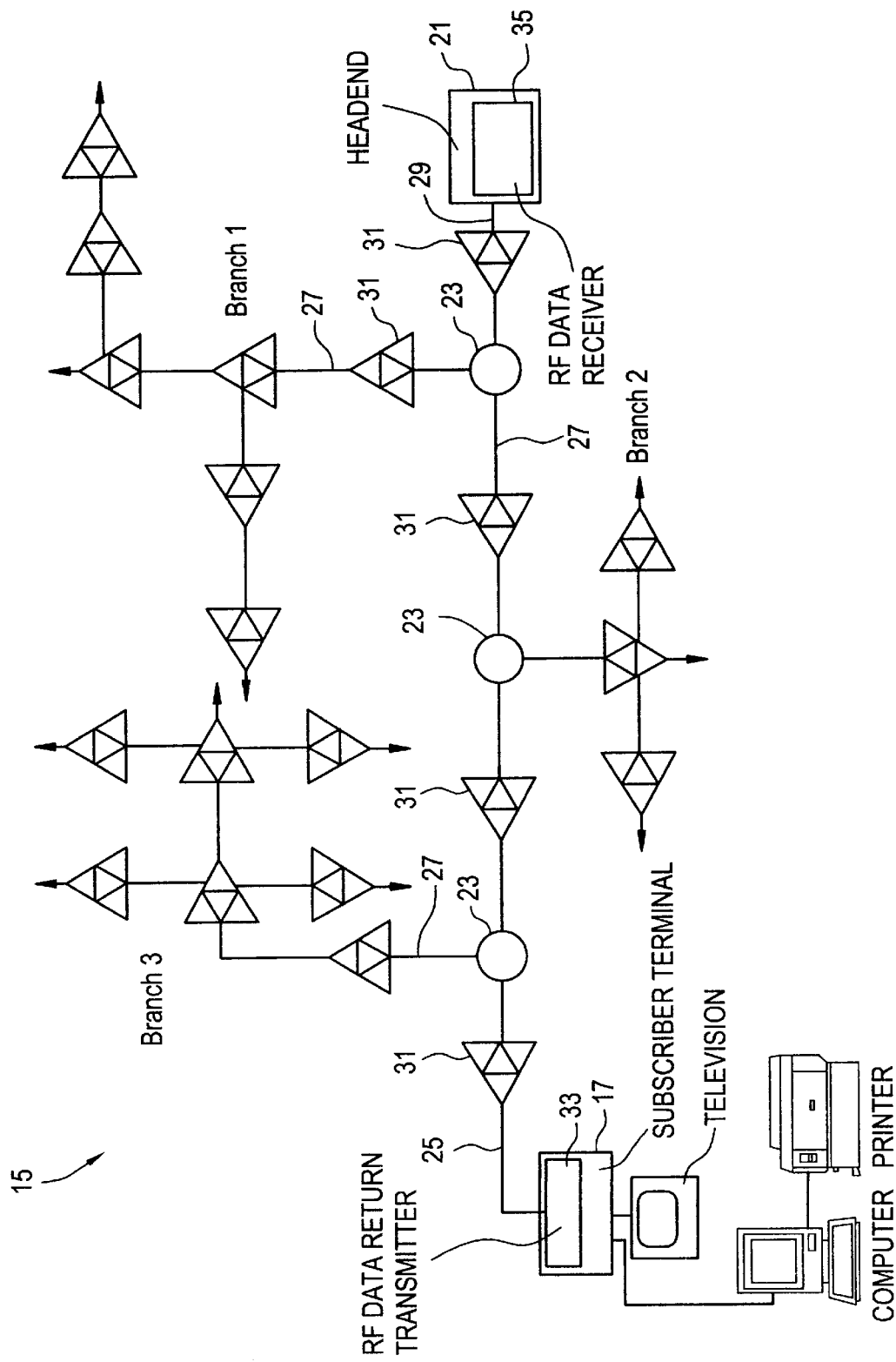
FIG. 1 is a block diagram illustrating a typical CATV forward frequency/return frequency transmission distribution plant.

The preferred embodiment will be described with reference to the drawing figures where like numerals represent like elements throughout.

With reference to FIG. 1, the topology of a typical CATV distribution plant 15 for distributing cable television signals downstream to a subscriber and for receiving return path messages from a subscriber CATV terminal 17 is shown. The CATV distribution plant 15 connects a headend to a plurality of subscribers through subscriber terminals 17. The distribution plant 15 begins with a coaxial or fiber optic trunk line 29 coupled to the headend 21. Some portions of the CATV plant may use optical fiber cable instead of coaxial transmission cables.

At points where the transmission cable divides, signal splitters/combiners 23 are installed. Drop lines 25, branch lines 27 and trunk line 29 provide the bidirectional transport medium between headend 21 and subscriber terminals 17 for the CATV system. Bidirectional signal amplifiers 31 are distributed throughout the cable plant 15 to boost and equalize a transmitted signal and insure that proper signal strength levels are maintained.

A frequency agile RF data return transmitter 33 is included in each terminal 17 and permits a subscriber to communicate with the headend 21 by transmitting messages in the return direction of the CATV plant 15. The headend 21 includes a frequency agile RF data receiver 35 for receiving messages transmitted by multiple return transmitters 33.

Figure 2:
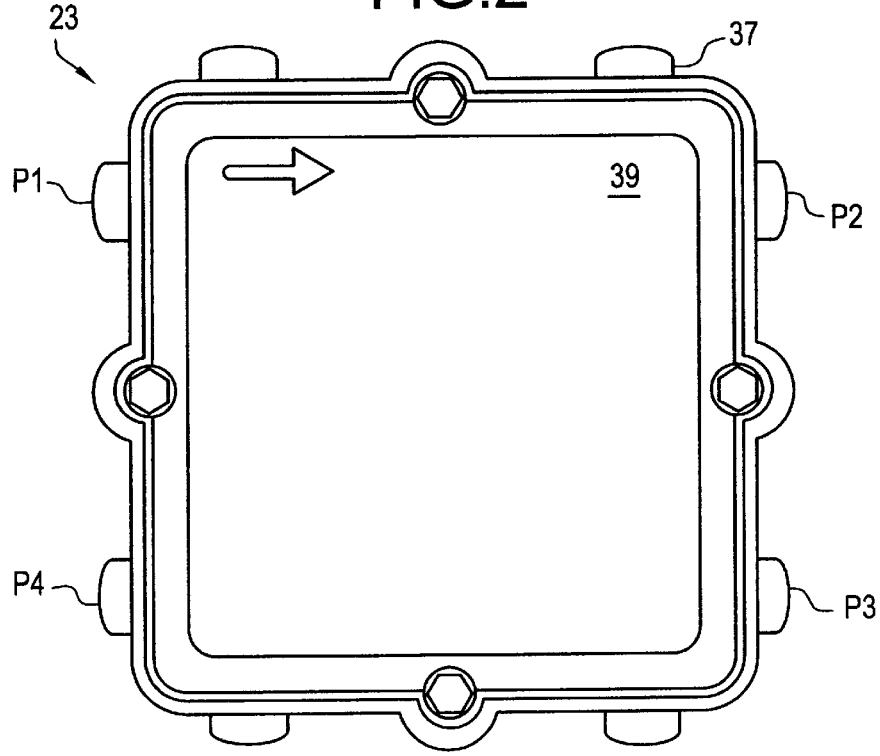
FIG. 2 is a front view of a CATV component enclosure embodying the present invention.
Figure 3:
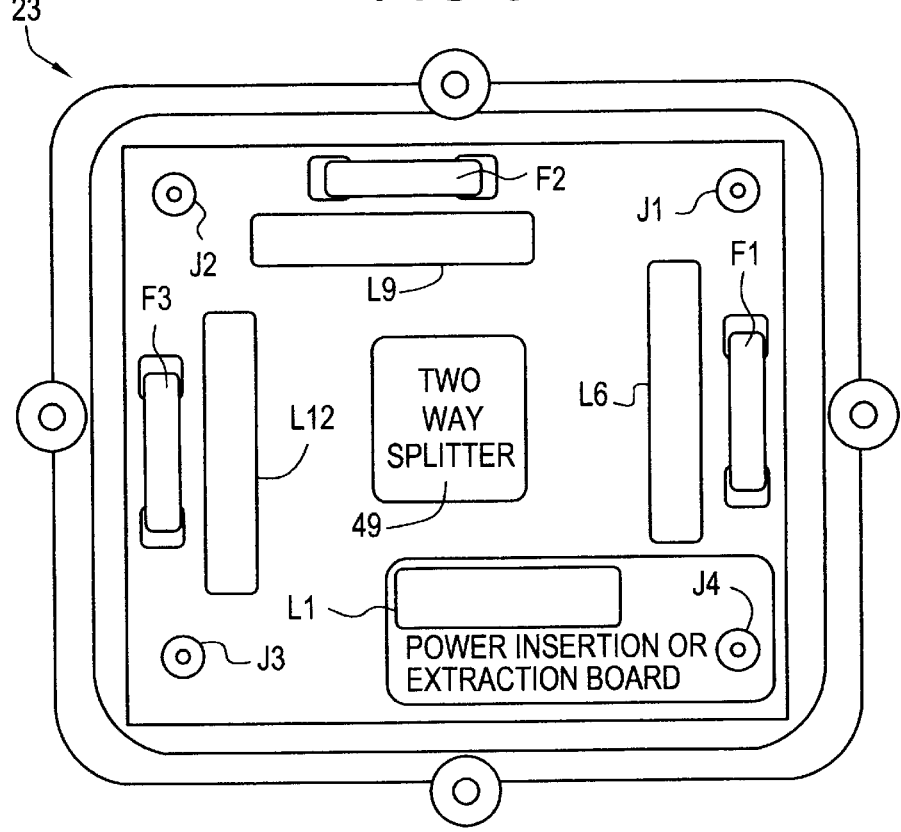
FIG. 3 is a rear view of the removed face plate showing a typical circuit board layout for the present invention.

As shown in FIG. 2, the present invention 23 includes an RF signal input port P1, first P2 and second P3 RF signal output ports and an alternating current input port P4. The device 23 is housed in a lightweight diecast aluminum alloy housing 37 with a rotatable faceplate 39 providing strand or pedestal mounting and RFI shielding. FIG. 3 shows a rear view of the faceplate 39 after removal from the device 23 with a circuit board visible. The four external ports P1, P2, P3 and P4 couple internally to a connector platform (not shown). The faceplate plugs into the connector platform coupling the external ports to corresponding RF input jack J1, first J2 and second J3 output jacks and an alternating current input jack J4.

Figure 4:
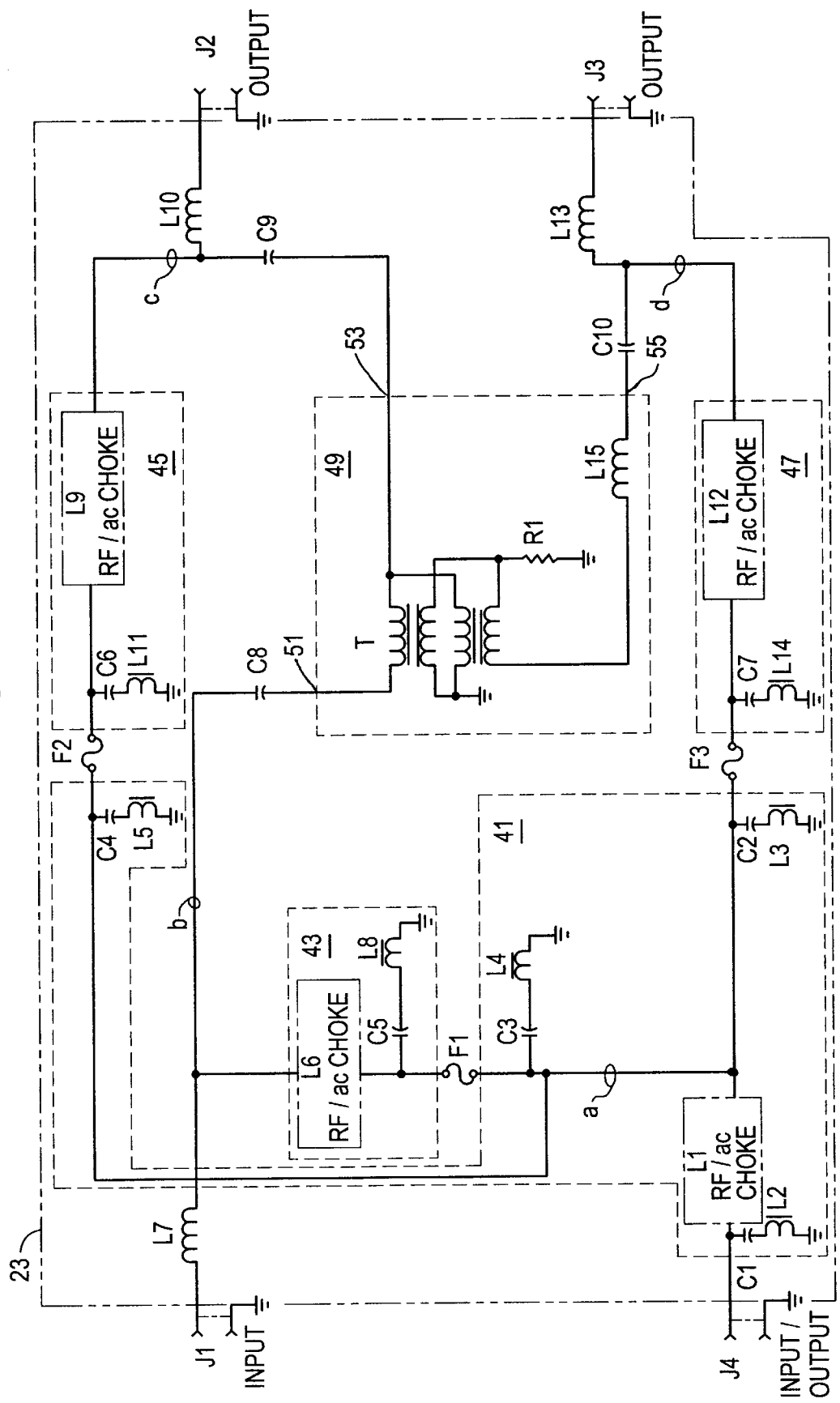
FIG. 4 is an electrical schematic of the present invention.

Referring now to FIGS. 3 and 4, the device 23 includes both power inserter and signal splitter functions. The power inserter includes the ac input, filtering and distribution, and coupling to the RF signal connections.

A three-pole 41 low-pass (low-frequency) filter is coupled to the signal terminal of the ac input jack J4 and comprises first C1, second C2, third C3 and fourth C4 capacitors and a first inductor L1 arranged in a pi-network with each capacitor having ferrite beads placed on one of their leads to prevent parasitic oscillations. The ferrite beads form corresponding second L2, third L3, fourth L4 and fifth L5 inductors. The pi-network provides low-pass filtering from an external alternating current power supply (not shown) which may be local to the device 23.

At a first node a, the filtered alternating current is distributed by first F1, second F2 and third F3 fuses to their respective RF signal jacks J1, J2 and J3. First 43, second 45 and third 47 two-pole, low-pass filters are coupled between each fuse and RF signal jack to provide additional filtering.

A fifth C5 capacitor and a sixth inductor L6 comprise the first 43 two-pole low-pass filter. The first 43 filter is coupled to a seventh L7 inductor at a second node b and to the first fuse F1. The seventh L7 inductor is also coupled to the signal terminal of the RF input jack J1. A ferrite bead placed on one lead of the fifth capacitor C5 forms an eighth L8 inductor.

A sixth capacitor C6 and a ninth inductor L9 comprise the second 45 two-pole low-pass filter. The second 45 filter is coupled to a tenth L10 inductor at a third node c and to the second fuse F2. The tenth L10 inductor is also coupled to the signal terminal of the first RF output jack J2. A ferrite bead placed on one lead of the sixth capacitor C6 forms an eleventh L11 inductor.

A seventh capacitor C7 and a twelfth inductor L12 comprise the third 47 two-pole low-pass filter. The third 47 filter is coupled to a thirteenth L13 inductor at a fourth node d and to the third fuse F3. The thirteenth L13 inductor is also coupled to the signal terminal of the second RF output jack J3. A ferrite bead placed on one lead of the seventh C7 capacitor forms a tenth L14 inductor.

The splitter 49 comprises a fifteenth L15 inductor as a calculated load, a first resistor R1 and an impedance matching transformer T1. The splitter 49 has an input 51 and first 53 and second 55 outputs and are coupled to each RF jack inductor L7, L10, and L13. The splitter 49 divides the RF signal while also inserting a calculated loss if required by the cable network design. The function of a splitter is well known to those skilled in the art of electronics and a functional discussion is beyond the scope of the present invention.

Eighth C8, ninth C9 and tenth C10 capacitors form one-pole high-pass filters passing the RF signals to and from the splitter while blocking the low frequency alternating current. The eighth C8 capacitor is coupled between the splitter input 51 and second node b, the ninth C9 capacitor is coupled between the first splitter output 53 and third node c and the tenth C10 capacitor is coupled between the second splitter output 55 and the fourth d node.

Since the coaxial cable is a transmission line conveying high frequency signals, the splitting network permits the division of the input signal without return reflection. The individual component values for the preferred embodiment are shown in Table 1.

TABLE 1

| COMPO-NENT | SPECIFICATIONS | COMPO-NENT | SPECIFICATIONS |
| --- | --- | --- | --- |
| C1 | 0.047 µF, 400 Vac | L5 | Ferrite Bead |
| C2 | 0.01 µF, 400 Vac | L6 | Power Passing Choke |
| C3 | 0.01 µF, 400 Vac | L7 | 1½ Turns, ⅛ in. Dia. |
| C4 | 0.01 µF, 400 Vac | L8 | Ferrite Bead |
| C5 | 0.047 µF, 400 Vac | L9 | Power Passing Choke |
| C6 | 0.047 µF, 400 Vac | L10 | 1½ Turns, ⅛ in. Dia. |
| C7 | 0.047 µF, 400 Vac | L11 | Ferrite Bead |
| C8 | 910 pF, 500 Vac | L12 | Power Passing Choke |
| C9 | 820 pF, 300 Vac | L13 | 1½ Turns, ⅛ in. Dia. |
| C10 | 910 pF, 500 Vac | L14 | Ferrite Bead |
| L1 | Power Passing Choke | L15 | 1½ Turns, ⅛ in. Dia. |
| L2 | Ferrite Bead | R1 | 82 Ω, ¼ W |
| L3 | Ferrite Bead | T2 | Splitter Transformer |
| L4 | Ferrite Bead | | |

The present invention 23 routes the alternating current through the low-pass filters 41, 43, 45 and 47 between each jack J1, J2, J3 and J4. The RF signal is passed between the RF signal jacks J1, J2 and J3 through the splitter 49. The high frequency RF signals are blocked by the low-pass filters establishing a current path while the low frequency alternating current is blocked by high-pass filters (C8, C9 and C10) establishing a signal path. The RF signal and alternating current paths are combined at the RF input J1 and output jacks J2 and J3. Power already present on the cable 27 at either the signal input P1 or output ports P2 and P3 may be accessed at the alternating current jack J4 for powering other CATV equipment.

The ability to impress an alternating or direct current source onto a signal is well understood by those skilled in the art of electronics. The combining of the alternating current and RF signals at the signal jacks form a composite waveform with the RF signals carried on the low-frequency alternating current sine wave. The function of the various orders of low-pass filters removes the low frequency alternating current from the composite signal leaving behind the RF portion which are the CATV services. In the presently preferred embodiment, alternating current is used to provide power throughout the CATV infrastructure. It is also possible that direct current may be similarly impressed upon the signal creating an offset in the RF signal indicative of the voltage magnitude.

While the present invention has been described in terms of the preferred embodiment, other variations which are within the scope of the invention as outlined in the claims below will be apparent to those skilled in the art.

I claim:

1. A passive component for splitting RF frequencies and distributing an impressed current having a signal input port, a plurality of signal output ports and a current port comprising:

a splitter having an input and a plurality of outputs;

said splitter input coupled to the signal input port via an upstream power/signal separator circuit, each of said splitter outputs coupled to one of the plurality of output ports via a downstream power/signal separator circuit;

each of said power/signal separator circuits having a signal connection, a power connection and a combined power/signal connection;

said splitter input coupled to said signal connection of said upstream circuit;

each of said splitter outputs coupled to said signal connection of a respective downstream power/signal separator circuit;

said input port coupled to said combined power/signal connection of said upstream power/signal separator circuit;

each of said output signal ports coupled to said combined power/signal connection of said respective downstream power/signal separator circuits;

said power connections of each of said power/signal separator circuits coupled together to define a power node; and said power node coupled to the current port.

2. The passive component according to claim 1 further comprising a power filter within the coupling between said current port and said power node.

3. The passive component according to claim 1 wherein said power/signal separator circuits further comprise:

a low-pass filter coupled between said power connection and said combined power/signal connection for blocking high frequencies and passing low frequencies; and a high-pass filter coupled between said signal connection and said combined power/signal connection for passing high frequencies and blocking low frequencies.

4. The passive component according to claim 3 wherein said high-pass and said low-pass filters have predetermined responses determined by varying orders.

5. The passive component according to claim 1 wherein a calculated loss may be inserted in one or more of the plurality of splitter outputs.

6. The passive component according to claim 1 wherein said passive component has a defined signal direction from the signal input port to the plurality of output ports.

7. The passive component according to claim 2 wherein said power filter comprises a pi-network low-pass filter.

8. The passive component according to claim 7 wherein said pi-network low-pass filter has a predetermined response.

9. The passive component according to claim 1 whereby power extraction or insertion may be performed at the current port.

10. A CATV passive component for splitting RF frequencies and distributing an impressed current having a signal input port, a plurality of signal output ports and a current sort comprising:

a splitter having an input and a plurality of outputs;

said splitter input coupled to the signal input port via an upstream power/signal separator circuit;

each of said splitter outputs coupled to one of the plurality of output ports via a downstream power/signal separator circuit;

each of said power/signal separator circuits having a signal connection, a power connection and a combined power/signal connection;

said splitter input coupled to said signal connection of said upstream circuit;

each of said splitter outputs coupled to said signal connection of a respective downstream power/signal separator circuit;

said input port coupled to said combined power/signal connection of said upstream power/signal separator circuit;

each of said output signal ports coupled to said combined power/signal connection of said respective downstream power/signal separator circuits;

said power connections of each of said power/signal separator circuits coupled together to define a power node; and said power node coupled to the current port.

11. The CATV passive component according to claim 10 further comprising a power filter within the coupling between said current port and said power node.

12. The CATV passive component according to claim 10 wherein said power/signal separator circuits further comprise:

a low-pass filter coupled between said power connection and said combined power/signal connection for blocking high frequencies and passing low frequencies; and a high-pass filter coupled between said signal connection and said combined power/signal connection for passing high frequencies and blocking low frequencies.

13. The CATV passive component according to claim 12 wherein said high-pass and said low-pass filters have predetermined responses determined by varying orders.

14. The CATV passive component according to claim 10 wherein a calculated loss may be inserted in one or more of the plurality of splitter outputs.

15. The CATV passive component according to claim 10 wherein said passive component has a defined signal direction from the signal input port to the plurality of output ports.

16. The CATV passive component according to claim 11 wherein said power filter comprises a pi-network low-pass filter.

17. The CATV passive component according to claim 16 wherein said pi-network low-pass filter has a predetermined response.

18. The CATV passive component according to claim 10 whereby power extraction or insertion may be performed at current port.

* * * * *

UNITED STATES PATENT AND TRADEMARK OFFICE
CERTIFICATE OF CORRECTION

PATENT NO. : 5,959,507
DATED : September 28, 1999
INVENTOR(S) : Richard Gresko

Page 1 of 2

It is certified that error appears in the above-identified patent and that said Letters Patent is hereby corrected as shown below:

On the title page, item [56], in the References Cited, under the U.S. Patent Documents section, please insert:

--3,671,885    6/1972    Pennypacker    333/131-- in the References Cited, under the Foreign Patent Documents section, please insert:

--WO 9732438    9/1997    PCT    H04O

WO 9747082    12/1997    PCT    H03F

WO 9610853    4/1996    PCT    H01R 16/12--

In claim 1, column 4, at line 63, after "of", insert --signal--;

In claim 1, column 5, at line 2, after "upstream", insert --power/signal separator--;

In claim 1, column 5, at line 6, prior to "input", delete "said" and insert --the signal--;

In claim 1, column 5, at line 9, delete "output signal", and insert --signal output--;

In claim 1, column 5, at line 11, delete "circuits", and insert --circuit--;

UNITED STATES PATENT AND TRADEMARK OFFICE
CERTIFICATE OF CORRECTION

PATENT NO. : 5,959,507
DATED : September 28, 1999
INVENTOR(S) : Richard Gresko

It is certified that error appears in the above-identified patent and that said Letters Patent is hereby corrected as shown below:

In claim 10, column 5, at line 53, after "of", insert --signal--;

In claim 10, column 6, at line 5, after "upstream", insert --power/signal separator--;

In claim 10, column 6, at line 9, delete "said input", and insert --the signal input--;

In claim 10, column 6, at line 12, delete "output signal", and insert --signal output--; and In claim 10, column 6, at line 14, delete "circuits", and insert --circuit--.

Signed and Sealed this

Twenty-third Day of May, 2000

Attest:

Q. TODD DICKINSON

*Attesting Officer*       *Director of Patents and Trademarks*